United States Patent [19]

Ferry et al.

[11] Patent Number: 5,001,480
[45] Date of Patent: Mar. 19, 1991

[54] ANALOG-TO-DIGITAL AND DIGITAL-TO-ANALOG CONVERSION SYSTEM AND ECHO CANCELLATION DEVICE INCLUDING THE SAME

[75] Inventors: Michel Ferry, Vallauris; Christian Jacquart, Carros, both of France

[73] Assignee: International Business Machines Corp., Armonk, N.Y.

[21] Appl. No.: 258,936

[22] Filed: Oct. 17, 1988

[30] Foreign Application Priority Data

Oct. 30, 1987 [EP] European Pat. Off. ........ 87480016.2

[51] Int. Cl.$^5$ ............................................. H03M 1/02
[52] U.S. Cl. .................................... 341/108; 341/165; 341/144
[58] Field of Search ............... 341/108, 126, 142, 163, 341/165, 144, 155; 324/99 R

[56] References Cited

U.S. PATENT DOCUMENTS

| | | | |
|---|---|---|---|
| 3,827,044 | 7/1974 | Toney et al. | 341/165 |
| 4,113,997 | 9/1978 | Horna | 341/138 X |
| 4,217,574 | 8/1980 | Anderson | 341/159 X |
| 4,348,768 | 9/1982 | Svala | 341/165 X |
| 4,532,494 | 7/1985 | Sasaki et al. | 341/143 |
| 4,578,667 | 3/1986 | Hollister | 341/163 X |

Primary Examiner—A. D. Pellinen
Assistant Examiner—Sharon D. Logan
Attorney, Agent, or Firm—Edward H. Duffield; Jerry W. Herndon

[57] ABSTRACT

A conversion system is disclosed for performing either an analog-to-digital A/D conversion associated with an amplification step or a digital-to-analog D/A conversion associated with an attenuation step. The system includes apparatus (115) for receiving a input digital word to be processed, i.e. converted into analog and then attenuated, and apparatus (165) for receiving a input analog value to be processed, i.e. amplified for scaling purposes and then converted into digital. It also includes a digital-to-analog D/A converter (110), an attenuator (120) for attenuating the analog output of D/A converter (110), and a comparator (150) for comparing the value of the input analog value to be processed and the output of said attenuator (120). The processing of the D/A-attenuation process is performed by both the D/A converter (110) and attenuator (120). In order to achieve the A/D-amplification process, the system further includes generator apparatus (140) for generating a sequence of digital words to the D/A converter (110), and storage apparatus (220) for storing among this sequence, the digital value that minimizes the difference between both input of comparator (150). This digital value is extracted as being the digital representation of the amplified analog input value. Since both A/D-amplification and D/A-attenuation processings involve the same physical components, both processing have transfer function exactly inverse of one another. The typical use of this circuit is in echo cancellation technique.

7 Claims, 9 Drawing Sheets

ANALOG-TO-DIGITAL AND DIGITAL-TO-ANALOG CONVERSION SYSTEM AND ECHO CANCELLATION DEVICE INCLUDING THE SAME

BACKGROUND

1. Field of the Invention

The invention relates generally to analog-to-digital and digital-to-analog conversion systems associated with proper scaling before A/D conversion and after D/A conversion, and particularly to such a system for an echo canceller.

2. Prior Art

Analog-to-digital (A/D) and digital-to-analog (D/A) converters have come widely into use because of the development of digital processing systems. For instance, in the technical field of control and monitoring systems, that is devices for maintaining conditions in operating systems as close as possible to desired values despite changes in the operating environment, analog components have traditionally been used. In the 1970's, the use of discrete or logical control elements and programmable logic controllers became widespread. This, in turn, allowed the development of digital control systems for monitoring such things as chemical processes, machine tools and other industrial processes and operations. To achieve this goal, analog-to-digital (A/D) converters are used to transform analog information, such as audio signals or measurements of physical variables (for example, temperature, force, or electric voltage) into a form suitable for digital handling. FIG. 1A illustrates a conventional case of process control involving analog components only in which the use of negative feedback provided by block 3 produces changes in the characteristics of the system which improve the performance of the system. In this automatic control system, feedback is used to compare, by means of subtracter 1, the actual output S of A system with a desired input E, the difference appearing at the output of subtracter 1 being used as the input signal of a controller 2. A high performance of the system in terms of dynamic performance and stability often involves a sophisticated feedback function in block 3 which may advantageously be designed by means of precise and cheap digital processing systems, as in FIG. 1B. However, when both output S and input E of the system are analog variables, the use of digital technology for providing the feedback function in block 4 involves the conversion of the first variable into digital form prior to any computation, and then the conversion of the digital output of block 4 into analog form in order to generate the analog variable E' that will be eventually used to produce the difference E-E'. However, in some environment of changing characteristics, the level of the electric voltage S to be converted is likely to vary significantly in a wide range. It is therefore essential to perform a proper scaling of the analog signal S prior to its conversion, in order to make the best use of the A/D converter precision. This A/D conversion is therefore performed after an amplification step in block 6. After computation in block 4, the digital result is converted back into its analog form in block 5 which performs the D/A conversion and then an attenuation for providing the analog value E'. In order to allow a high performance of the system, the precise mastering of the transfer functions of block 4, 5 and 6 is most desirable and particularly, both transfer function of blocks 5 and 6, i.e. both A/D-amplification and D/A-attenuation processings, should be accurately inverse of each other.

Similarly, echo cancellation techniques allowing high speed full-duplex data communication on a single channel also require precise transfer functions included into the echo cancelling loop in order to achieve high rejection ratios for the echo. The cancellation of the echo is achieved by an echo estimator which generates an estimation of the value of the echo signal that spoils the received signal from a far-end data control equipment such as a modem. The estimated echo is subtracted from the received signal in order to produce a signal being as close as possible to the ideal received signal having no echo. The estimation of the echo by means of digital processing systems in a standard analog 4-wire modem again involves two accurate A/D-amplification and D/A-attenuation transfer functions. This particular case will be described in detail with respect to FIGS. 7A, 7B and the figures following them.

In the background art, the design of precise transfer functions, and particularly two transfer functions being accurately inverse of one another for performing a A/D conversion associated with an amplification step, and a D/A conversion associated with a attenuation step have always involved adjustable components and precise elements which inevitably increase the final cost of the system. Moreover, even precise adjustments can not guarantee accurate transfer functions since the values of the components are subject to long-term shift.

OBJECTS OF INVENTION

[Therefore, it is an object of the invention to provide improved pairs of transfer functions which are accurately the inverse of one another, the first one for performing an A/D conversion associated with an amplification step, and the second for performing a D/A conversion associated with an attenuation step.]

It is another object of the invention to provide an improved conversion system for performing either an A/D-amplification conversion or a D/A-attenuation conversion, thereby allowing easy use of digital processing systems in conventional analog control systems.

It is further object of the invention to provide an improved conversion system for performing either an A/D-amplification conversion or a D/A-attenuation conversion, thereby allowing the design of an inexpensive, high performance echo cancellation devices for data control equipment.

BRIEF SUMMARY OF INVENTION

In order to attain the above objects, there is provided a conversion system for performing either an analog-to-digital A/D conversion associated with an amplification step or a digital-to-analog D/A conversion associated with an attenuation step. The system includes means (115) for receiving an input digital word to be processed, i.e. converted into analog and then attenuated, and means (165) for receiving an input analog value to be processed, i.e. amplified for scaling purposes and then converted into digital. It also includes an digital-to-analog D/A converter (110), an attenuator (120) for attenuating the analog output of D/A converter (110), and a comparator (150) for comparing the value of the input analog value to be processed and the output of said attenuator (120). The processing of the D/A-attenuation process is performed by means of both D/A converter (110) and attenuator (120). In order to achieve the A/D-amplification process, the system further includes means (140) for generating a sequence of digital words to the D/A converter (110), and means (120) for storing among this sequence, the digital value that minimizes the difference between both inputs of comparator (150). This digital value is extracted as being the digital representation of the amplified analog input value. Since both A/D-amplification and D/A-attenuation processing involve the same physical components, both processes have transfer functions exactly the inverse of one another. The typical use of this circuit is in echo cancellation techniques and apparatus.

DESCRIPTION OF THE INVENTION

Figure 1A:
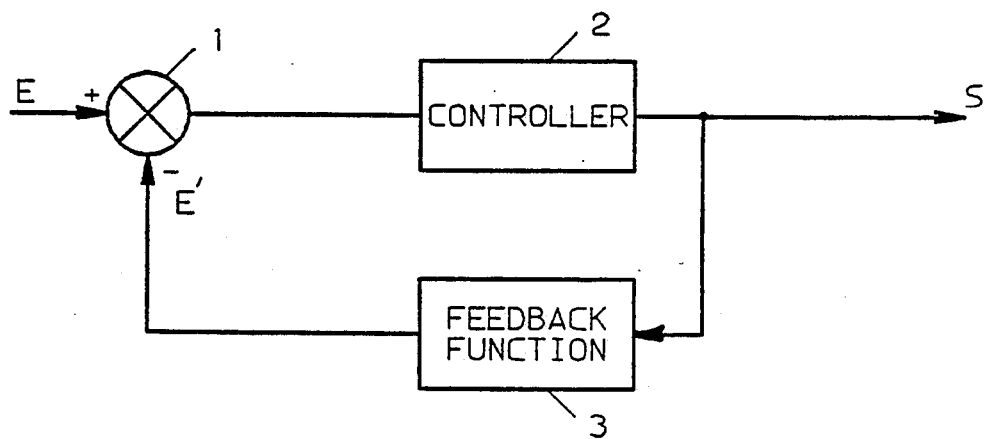
FIG. 1A and 1B illustrate the prior art use of a digital feedback function in an analog process control system.
Figure 1B:
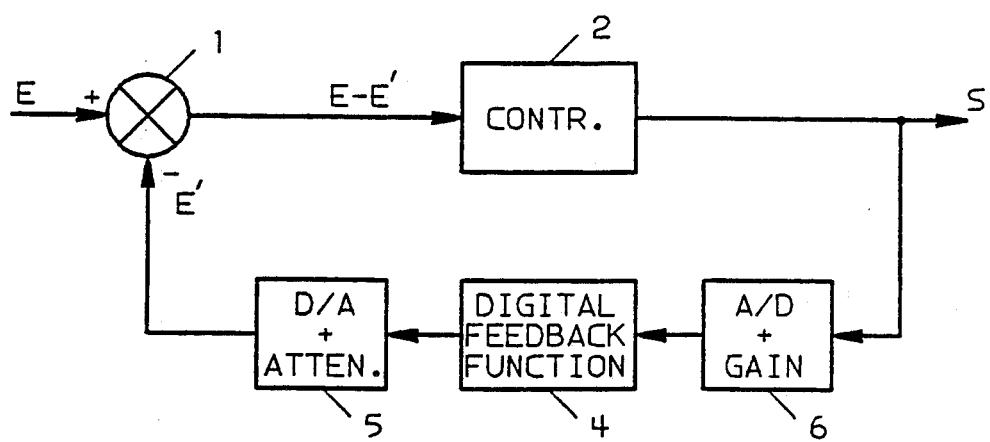
Figure 2:
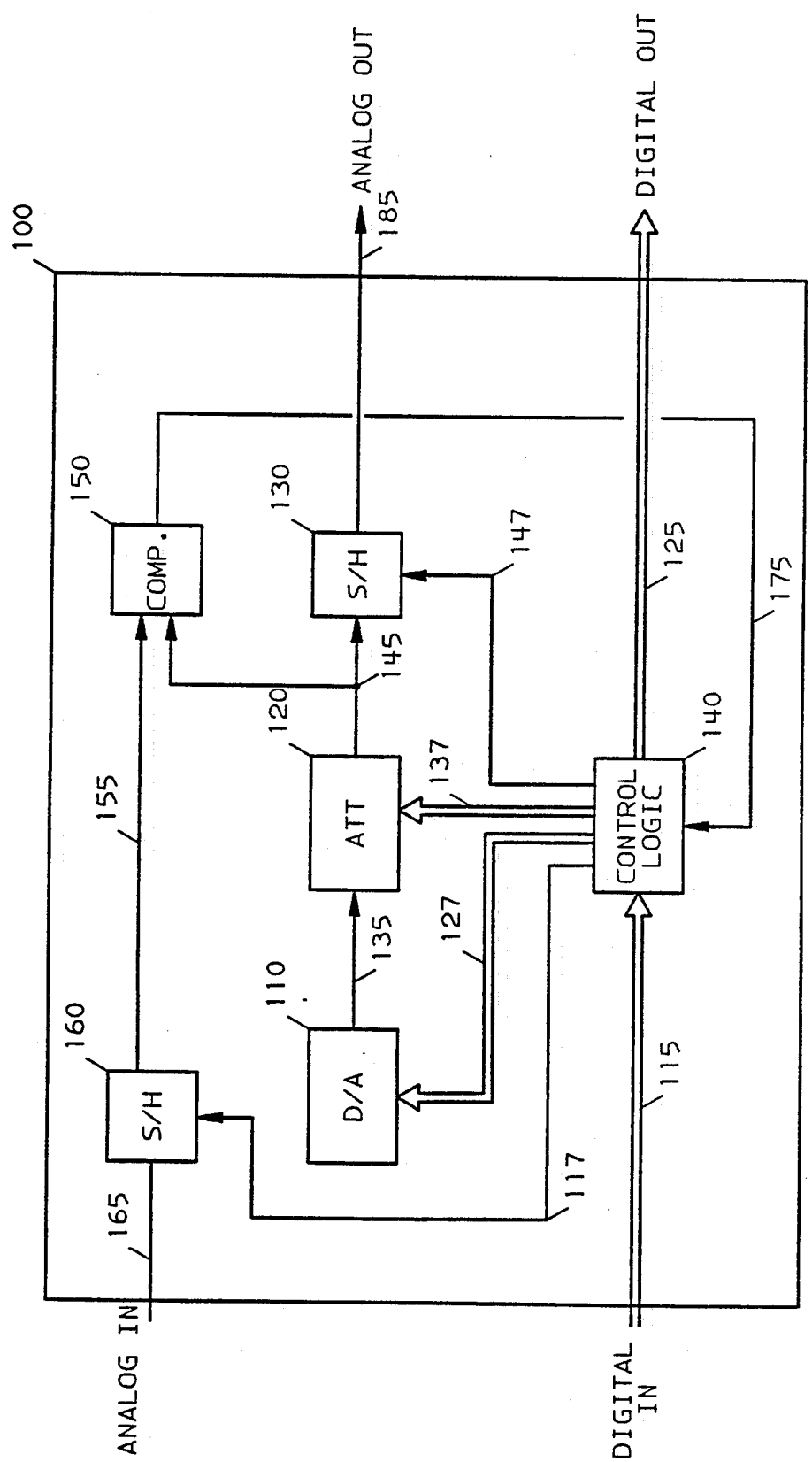
FIG. 2 illustrates the basic concept of the invention.

In FIG. 2, the basic elements making up the an embodiment of the invention, referenced as block 100, are described. Block 100 includes a digital to analog (D/A) converter 110, the output of which is connected to an attenuating device 120 by means of lead 135. The output of attenuator 120 is connected to a first input of a comparator 150 and to a sample/hold (S/H) circuit 130 by means of lead 145. The output of S/H circuit 130 provides on lead 185, the analog value corresponding to the digital output transmitted to control logic 140 on bus 115. In order to perform the analog to digital conversion, block 100 also includes a second sample/hold circuit 160 receiving the analog value to be converted on lead 165 and having its output connected to a second input of comparator 150 by means of lead 155. The output of comparator 150 is transmitted to Control Logic 140 by means of lead 175. Control Logic 140 respectively controls S/H circuit 160, D/A converter 110, attenuator 120 and S/H circuit 130 by means of lead 117, busses 127 and 137 and lead 147. Control Logic 140 eventually provides on bus 125, the digital equivalent of the analog value entered in S/H circuit 160.

The digital to analog conversion associated with an attenuation step operates as follows: The digital information to be converted enters Control Logic 140 by means of bus 115. It should be noticed that the transmission of the digital value can be performed as well serially as in parallel as shown in FIG. 2. Control Logic 140 transfers on bus 127 this digital value to D/A circuit 110 which provides the analog representation of the digital value to the programmable attenuator 120. The attenuated analog value thus calculated is memorized into S/H circuit 130 in order to release previous blocks for another conversion, be it analog to digital or the inverse, digital to analog. It should be noticed that the D/A can be one of various types well known in the background art: for instance, it may be a flash D/A converter using resistor networks, current sources, capacitor networks or any mix of these. The D/A circuit can also be made up by means of a ramping D/A converter using a current source charging a capacitor, or even several ramps of different values at the same time or cascaded. Programmable attenuator 120 may also be one of well-known attenuating device in the background art. It is generally made of a resistor network with cascaded cells and analog switches controlled by Control Logic 140. However, it can also be made of capacitors and switches synthesizing the resistors using switched capacitor techniques widely used with CMOS technology. Both S/H circuits 130 and 160 generally include an operational amplifier, a holding capacitor and means for inhibiting the input stages of the operational amplifier. This technique is well suited for bipolar technology. However, CMOS technology generally involves some different techniques, and particularly an operational amplifier, at least one integrated capacitor and two CMOS switches.

The analog to digital conversion associated with an amplification step is performed the follows:

The analog signal existing on lead 165 is first entered into S/H circuit 160 in which, a sample is memorized. As mentioned previously, the advantage provided by S/H circuit 160 is that the analog-to-digital conversion can be started, interrupted as soon as an analog sample is held into S/H circuit 160, then followed by a digital-to-analog conversion step and eventually resumed in the state it was when the interruption occurred. However, if the possibility of a interruption is not required in the analog-to-digital process, then S/H circuit 160 may easily be suppressed. In order to perform the analog-to-digital conversion followed by an amplification step, Control Logic 140 generates a sequence of successive digital values on bus 127. These are converted into their analog representation by D/A circuit 110 and then attenuated by means of attenuator 120. The output of attenuator 120 is transmitted to be compared in comparator 150 with the analog value previously sampled and hold in S/H circuit 160. Comparator 150 is used to determined the sign of the difference between its two inputs so that Control Logic 140 may determine the best digital approximation of the amplified analog input value.

Assume that K is the value of the attenuation performed by attenuator 120 $(0<k<1)$. At the end of the D/A conversion, one may write the following relation:

(Digital Value provided by CL 140) $\times k =$ analog value loaded into S/H 160 therefore:

Digital value $= (1/k) \times$ (analog value loaded into S/H 160)

Since the value K lies between 0 and 1, 1/K may vary from 1 to infinity. Thus, an analog-to-digital conversion associated with an amplification step, with the transfer function of the cascade A/D-amplification being accurately inverse to that of the cascade D/A-attenuation, has been performed.

The analog-to-digital conversion associated with an amplification step is then completed. Control Logic 140 transfers to bus 125, the above digital value which is the already mentioned best digital approximation of the amplified analog value.

The generation of the sequence of successive digital values performed by Control Logic 140 can be achieved by means of different algorithms. For instance, the above generation may be made on the basis of a successive approximation. In this case, Control Logic 140 first generates a digital value having the most significant bit (MSB) set to one and all remaining bits set to zero. If the output of attenuator 120 is lower than the analog value loaded into S/H circuit 160, this comparison being performed by comparator 150, Control Logic 140 keeps the MSB set, but resets it otherwise. Then, Control Logic 140 sets the second bit to one and the second digital value so produced is processed similarly. This algorithm has the advantage to be generally the fastest of all, as long as the A/D-converter embodies a D/A converter.

Another algorithm may be used for generating the sequence of digital values. This one involves the generation of ramps sweeping all possible digital values. This method is much longer than the former one, especially when a great number of bits is involved in the digital value. However, it has the advantage of providing inherently monotonous conversions.

Figure 3:
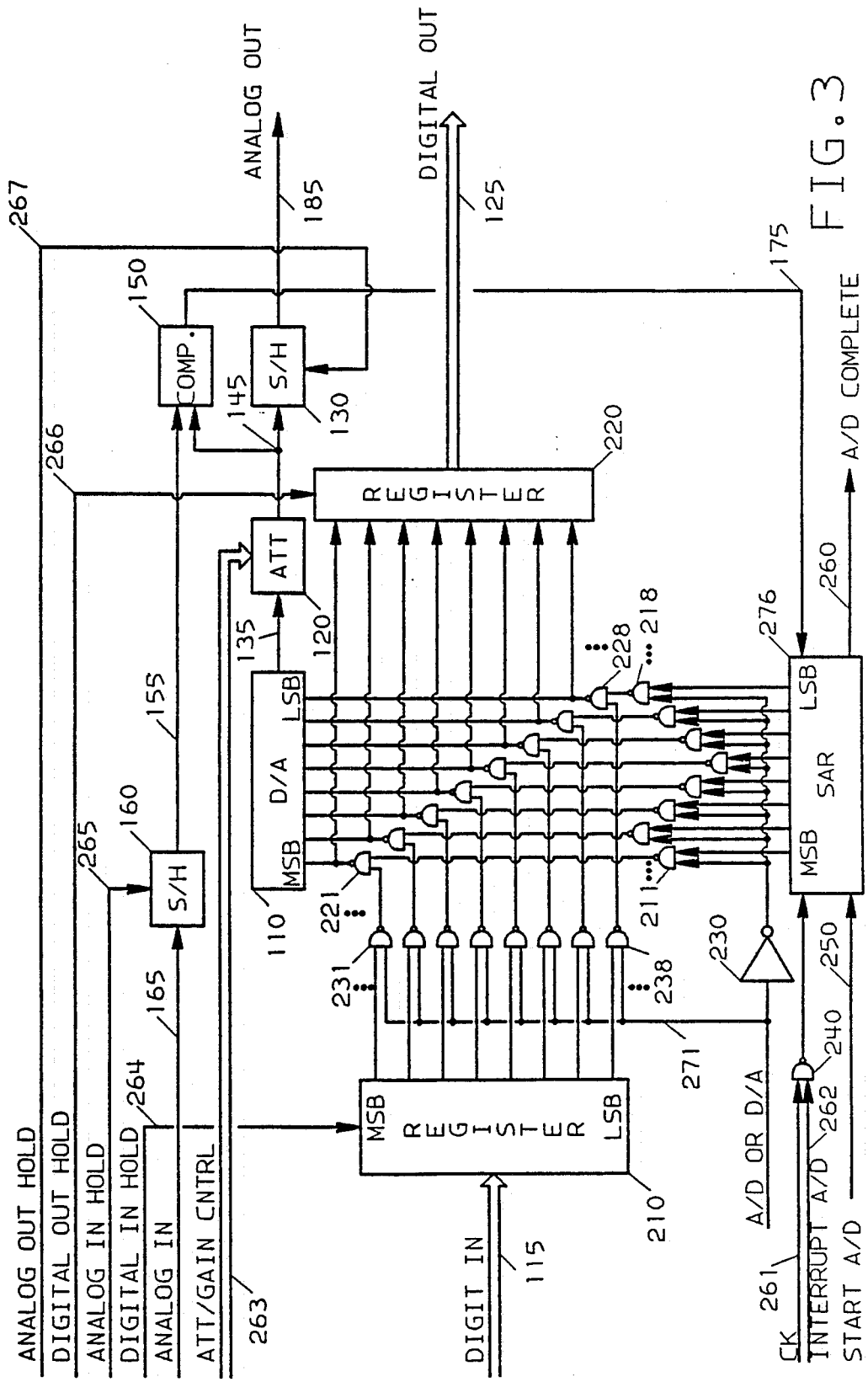
FIG. 3 illustrates a preferred embodiment of the invention involving a successive approximation algorithm.

With respect to FIG. 3, a preferred embodiment of the invention is illustrated. In this embodiment, the generation of digital values performed by Control Logic 140, is made on the basis of a successive approximation. In addition to the already involved blocks and mentioned with respect to FIG. 2, the invention now involves two registers 210 and 220. Register 210 is an usual 8-bit register designed for storing the value of the digital word to be processed and transmitted by bus 115. For the purpose of simplicity, FIG. 3 illustrates an embodiment of the invention involving 8-bit digital words, but words of more or less than 8-bits could be used in the same way. Register 220 stores the value of the digital word provided by the A/D-amplification process. The output of register 210 is connected to a series of 8 NAND gates 231 to 238. Only two numeral references 231 and 238 have been indicated in FIG. 3 for the purpose of clarity. The most significant bit (MSB) of register 210 is connected to a first input of NAND gate 231. The second most significant bit of register 210 is connected to a first input of NAND gate 232, and so on. Therefore, the least significant bit (LSB) of register 210 is connected to a first input of NAND gate 238. Every second input of all NAND gate 231 to 238 is connected to "A/D to D/A" control lead 271 which is also connected to the input of an inverter 230. The outputs of this first series of 8-NAND-gates 231 to 238 are connected to a second series of 8-NAND-gates 221 to 228. For clearness purpose, only two numeral references have again been indicated: 221 and 228. The first series of 8-NAND-gates to the second series is made according to the following: the output of the first NAND gate 231 of the first series is connected to a first input of the first NAND gate 221 of the second series. Similarly, the output of the second NAND gate 232 of the first series is connected to a first input of the second NAND gate of the second series, and so on. All outputs the second series of NAND gates 221 to 228 constitute an 8-bit-bus which is transmitted to D/A converter 110 and also to the input of register 220 in order to get out the digital result of the A/D-amplification processing after each conversion cycle. All second inputs of the second series of NAND gates 221 to 228 are connected to the outputs of a third series of 8-NAND-gates 211 to 218. Only the numeral references corresponding to NAND gates 211 and 218 have been indicated in the figure. The connection between both second and third series of NAND gates are as in the following: the output of the first NAND gate 211 of the third series is connected to the second input of the first NAND gate 221 of the second series. Similarly, the output of the second NAND gate 212 of the third series is connected to the second input of the second NAND gate 222 of the second series, and so on. At last, the output of NAND gate 218 of the third series is connected to the second input of the NAND gate 228 of the second series. All first inputs of the third series of NAND gates 211 to 228 are constituting an 8-bit bus that receives an 8-bit word from a SAR block 276.

The digital-to-analog conversion is performed as follows. Attenuator 130 is adjusted to the required attenuation value by means of a "Att/gain Ctr" control bus 263. "A/D or D/A" lead 271 is set to a high level corresponding to a Digital-to-analog conversion. This entails the locking of all NAND gates 211 to 218 of the third series of NAND gates by means of inverter 230, the output of which being set to a low level. The digital word to be processed is then entered and stored into register 210 by setting to high level "Digital in hold" lead 264. It should be noticed that register 210 is necessary only when the digital word to be converted is not guaranteed to remain stable during one D/A conversion cycle. The digital word entered is therefore converted by D/A converter 110, then attenuated by attenuator 120 and then transmitted to the input of S/H circuit 130 on lead 145. "Analog out hold" control lead 267 is set to a high level so that the analog value loaded into the latter circuit 130 is kept at the analog output lead 185.

The analog-to-digital conversion followed by an amplification step is performed as follows:

Firstly, programmable attenuator is controlled to provide the required attenuation step by means of "Att-/gain Cntrl" lead 263 already used previously. If the value carried on the latter lead remains unchanged, the analog value entered into S/H circuit 160 will be processed with a transfer function being exactly the inverse of that that processed the digital word entered into register 210 previously. Thus, the overall gain provided by the analog-to-digital processing is opposite, from a decibel standpoint, to the attenuation provided by the digital-to-analog processing. The analog value existing on lead 165 is sampled and held in S/H circuit 160 by means of a high level on "Analog in hold" lead 265. "A/D or D/A" lead 271 is set to a low level, which locks the first series of NAND gates 231 to 238 and unlocks the third series of NAND gates 211 to 218 by means of inverter 230.

An "Interrupt A/D" lead is then set to a high level so that a clock signal existing on lead 261 is transmitted through a NAND gate 240 to a successive approximation register (SAR) 276. The latter register 276 is a circuit for providing digital words according to the successive approximation algorithm described above. This circuit may be any of the circuits currently available in commerce, usually providing 8, 12 or 16 bit-words. In order to start the analog-to-digital conversion, "start A/D" control lead 250 is set to a high level and reset at the same clock period. Consequently, SAR circuit 276 produces a first digital word having its MSB set to one and the other bits set to zero. According to the result of the comparison performed by comparator 150 and transmitted to SAR circuit 276 by lead 175, SAR circuit amends or not the MSB and produces a second digital word with the amended MSB or not and the second most significant bit set to 1 and bits 3 to 8 set to zero. This second word is processed and the second significant bit is amended, if needed, consequently. At the end of the conversion, "A/D complete" lead 260 is set at a high level by SAR circuit 276. The "Digital out hold" control lead 266 is also reset in order to store the SAR output into register 220. Then, the result of the A/D-amplification processing may be taken from bus 125 by an external device.

Because of NAND gate 240, the A/D conversion may be interrupted by setting "interrupt A/D" lead 240 to a low level. This entails the vanishing of the clock signal existing on lead 261 at the input of SAR circuit 276. Consequently, the switching of "A/D or D/A" lead will allow a prioritary digital-to-analog conversion to to be performed. Switching back the latter lead and reactivating the clock at the input of SAR circuit 276 will allow analog-to-digital conversion to be resumed where it was interrupted.

The preferred embodiment described involved wired logic. The advantage of doing so contrary to the use of a processor implementation comes from the speed of the digital-to-analog conversion thus allowed. However, it should be noticed that a man of skill in the art can use the same principle in order to design a processor implementation involving less components than its equivalent wired logic solution.

Figure 4:
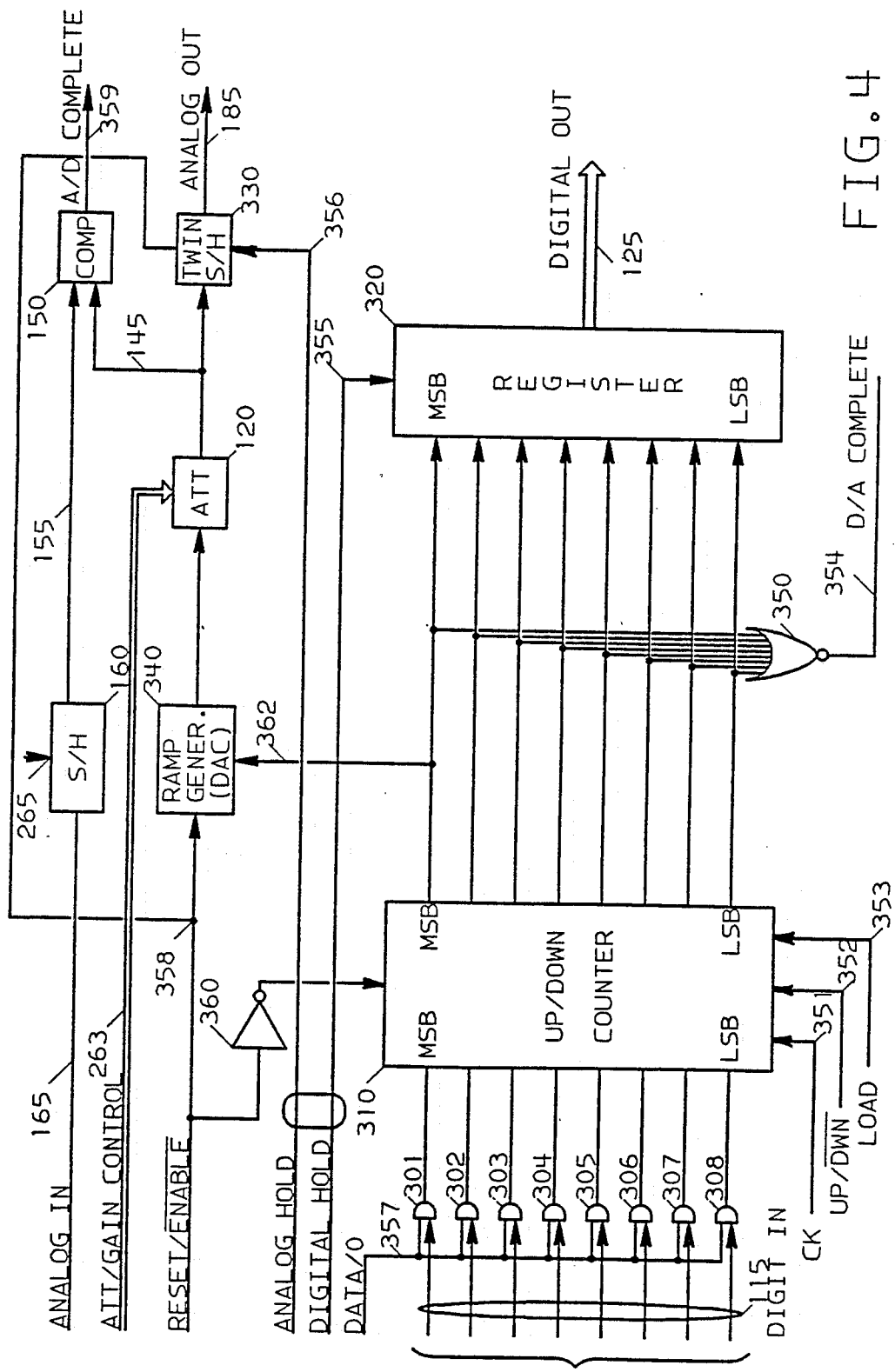
FIG. 4 illustrates a second preferred embodiment involving a ramp generator.

With respect to FIG. 4, a second preferred embodiment is described, in which the analog-to-digital conversion is achieved on the basis of a ramp generation. This embodiment has the disadvantage of being slower than that described above. It may involve either processor or wired logic technology. For clarity's sake, it illustrates a wired-logic embodiment using a single ramp. This embodiment includes, in addition to the elements already mentioned with respect to FIG. 2, an Up/down counter 310 for producing a sequence of successive digital words in parallel with the generation of a analog ramp produced by a ramp generator 340. Up/down counter 310 may be loaded with the digital word to be converted by means of a series of AND gates 301 to 308 which are controlled by a single "data/0" lead 357. The connection between bus 115 carrying the digital word and up/down counter 310 is as in the following: the most significant bit of the digital word to be converted is connected to a first input of the first AND gate 301. Similarly, the second most significant bit of bus 115 is connected to a first input of the second AND gate 302 of the series of AND gate 301 to 308, and so on. Every second input of all AND gates of this series is connected to a "data/0" lead 357.

The digital-to-analog processing is initiated by the following steps: "Reset/enable" lead 358 is set to a high level, which resets the ramp generator 340. Similarly, "data/0" lead 357 is set in order to allow the digital word to be transmitted through the series of AND gates 301 to 308 to up/down counter 310. The loading of this digital word is performed by a high level on "load" lead 353. Also, "up/down" lead is set to a level corresponding to a decrementing operation of up/down counter 310. After having adjusted the proper attenuation of attenuator 120 controlled by means of "Att/gain control" bus 263, "reset/enable" lead 358 is switched so as to allow the simultaneous start of both ramp generator 340 and up/down counter 310. This is achieved by means of an inverter 360 receiving the level existing on "reset/enable" lead 358 and controlling up/down counter 310. From this instant, up/down counter starts counting from the digital value loaded by means of the series of AND gate 301 to 308 and down to zero. The output of up/down counter 310 is an 8-bit bus driving a register 320 and decoded by an 8-bit NOR gate 350. As soon as up/down counter 310 reaches the digital value zero, the latter is decoded by NOR gate 350 which raises the level of "D/A complete" lead 354. Consequently to the switching of "D/A complete" lead 354, "analog hold" lead 356 is set in order to store into the first stage of a twin S/H circuit 330 the analog value produced by attenuator 120. At the next digital-to-analog processing, twin S/H circuit 330 transfers the analog signal from its first stage to its second stage which is eventually presented to "analog out" lead 185. Twin S/H circuit is necessary when the conversion time is a significant part of the conversion cycle. In the reverse case, an usual S/H circuit such as that used with respect to FIG. 3, may be used. A feedback loop is inserted into the D/A processing by means of a lead 362 which connects the MSB at the output of Up/down register 310 to ramp generator 340. Basically, this MSB is integrated to generate a MSB average signal. The latter is used by ramp generator 340 to adjust the offset of its output so that the middle of the full analog scale, generally the middle of the power supply voltage, coincides with the output of ramp generator 340 at the instant when MSB switches.

The analog-to-digital processing is achieved as follows: "Data/0" lead 357 is reset in order to reset ramp generator 340 by means of "Reset/enable" lead 358. Subsequently, up/down counter 310 is preset to the digital value zero by "data/0" lead 357. "load" lead 353 is set and "up/down" lead 352 is set to a level corresponding to an incrementing operation of up/down counter 310. The attenuation of the analog output of ramp generator 340 provided by attenuator 120 is adjusted to a proper value by means of "Att/gain control" bus 263. As mentioned previously, in the case where "Att/gain control" bus remains unchanged, the overall gain provided by the A/D-amplification process will by exactly inverse of the attenuation provided by D/A-attenuation process. Then, "reset/enable" lead 358 is switched so that both ramp generator 340 and up/down counter 310 start simultaneously. When the output of attenuator 120 reaches the value of analog value loaded by lead 155, comparator sets "A/D complete" lead 359. Consequently, "digital hold" lead 355 is set and the counter output is transferred into register 320 and the digital value is made available at "digital out" bus 125.

Figure 5:
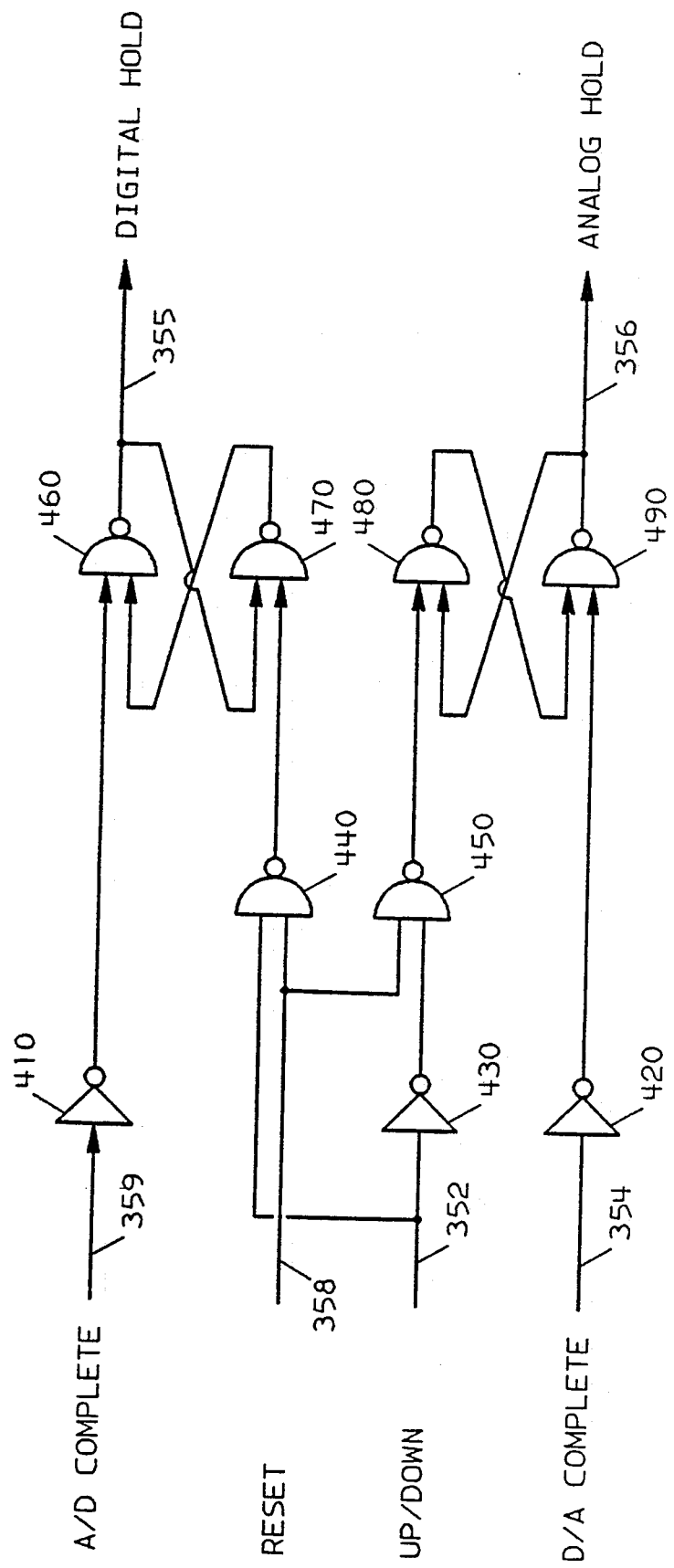
FIG. 5 illustrates the way of generating "digital hold" and "analog hold" control signals.

With respect to FIG. 5, there is described how signals existing on "digital hold" lead 355 and on "Analog hold" lead 356 can be generated. The circuit shown involves four NAND gates 460, 470, 480 and 490 making up two latches. Signal on "A/D complete" lead provided by comparator 150 is transmitted through an inverter 410 to the first input of NAND gate 460. The second input of NAND gate 460 is connected to the output of NAND gate 470. Conversely, the output of NAND gate 460 is connected to a first input of NAND gate 470. Reset signal on lead 358 is transmitted to a first input of a NAND gate 440, the output of which is connected to the second input of NAND gate 470. The second input of NAND gate 440 is receiving "Up/down" signal on lead 352 which is also transmitted through an inverter 430 to a first input of a NAND gate 450. Its second input receives "Reset" signal from lead 358. The output of the latter NAND gate 450 is connected to the first input of NAND gate 480. The second input of NAND gate 480 is connected to the output of NAND gate 490. Conversely, the output of NAND gate 480 is connected to a first input of NAND gate 490. The second input of this gate receives the complement signal of "D/A complete" after it has been processed by an inverter 420.

Figure 6:
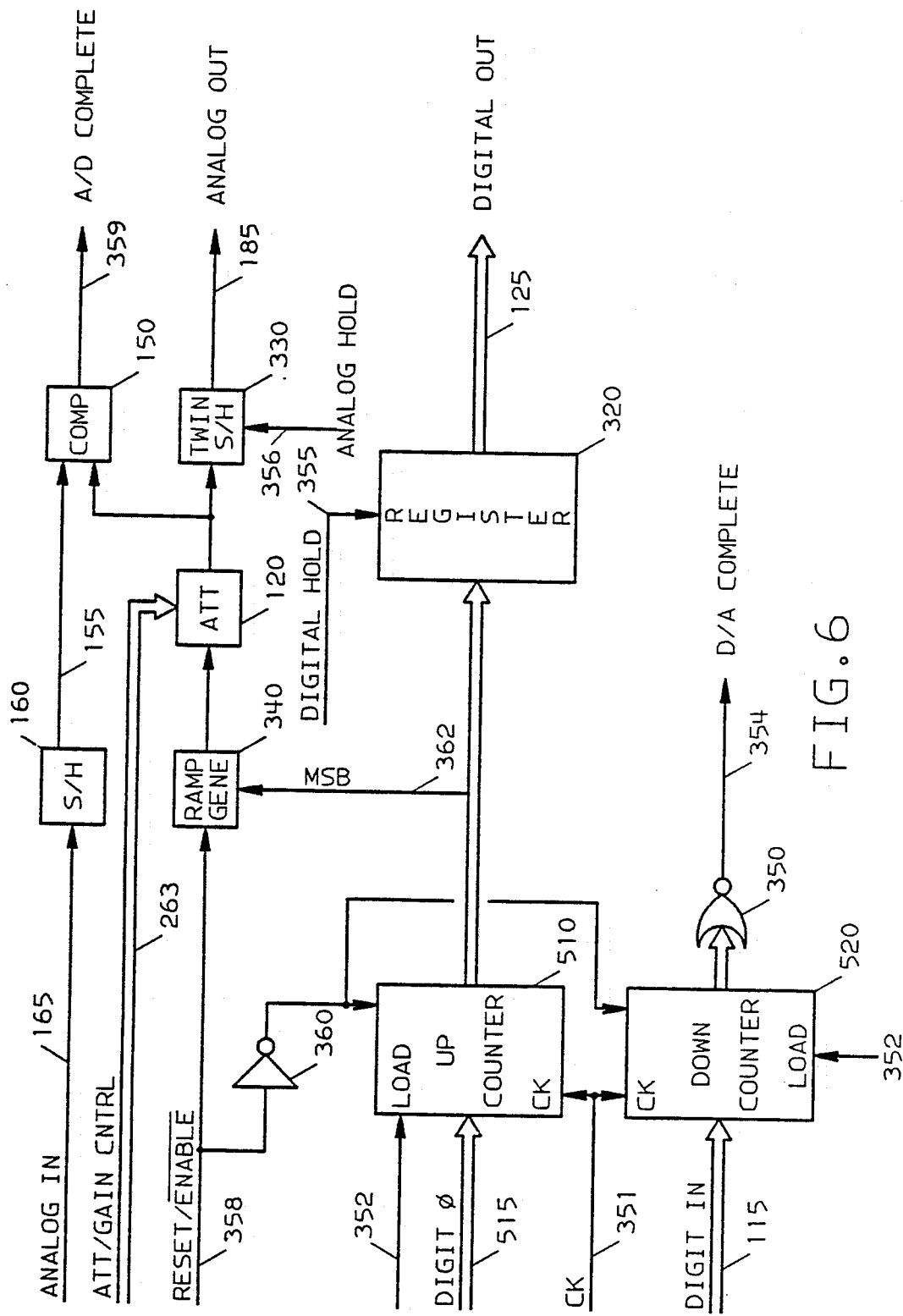
FIG. 6 illustrates a conversion system of the invention allowing simultaneous A/D-amplification and D/A-attenuation conversions.

For explanation purposes, A/D and D/A processing have been implemented as exclusive. Actually, they can be performed simultaneously on the condition that they are synchronous. In this particular case, two separate counters are needed: one for the counting up and the second for counting down. This is illustrated in FIG. 6: an "up" counter 510 and "down" counter 520 can operate simultaneously. The digital-to-analog processing is initiated by the following steps: "Reset/enable" lead 358 is set to a high level, which resets the ramp generator 340. In contrast with what is preceding, the digital word to be converted is entered directly into "down" counter 510 by means of "load" lead 352. After the adjustment of the proper attenuation value of attenuator 120 controlled by means of "Att/gain control" bus 263, "reset/enable" lead 358 is switched so that to allow the simultaneous start of both ramp generator 340 and "down" counter 520. This is achieved again by means of inverter 360 receiving the level existing on "reset/enable" lead 358 and controlling both "down" counter 520 and "up" counter 510. From this instant, "down" counter 520 starts counting from the digital value loaded previously down to zero at the speed of clock signal existing on lead 351. As soon as "down" counter 520 reaches the digital value zero, the latter is decoded by NOR gate 350 which raises the level of "D/A complete" lead 354. Consequently, "analog hold" lead 356 is set, according to the part of the description relating to FIG. 4, in order to store into the first stage of twin S/H circuit 330 the analog value produced by attenuator 120. Similarly as above, at the next digital-to-analog processing, twin S/H circuit 330 transfers the analog signal from its first stage to its second stage which is eventually presented to "analog out" lead 185.

The analog-to-digital processing is achieved simultaneously to the operations above: Ramp generator 340 is reset by means of "Reset/enable" lead 358. Lead 352 is set, which initiates the loading into "up" counter 510 of the digital word zero always existing on bus 515. Then, "reset/enable" lead 358 is switched so that both ramp generator 340 and "up" counter 510 (and also "down" counter 520) start simultaneously. When the output of attenuator 120 reaches the value of analog value loaded by lead 155, comparator sets "A/D complete" lead 359. Consequently, "digital hold" lead 355 is set and the counter output is transferred into register 320 and the digital value is made available at "digital out" bus 125. The generation of "digital hold" and "analog hold" signals on lead 355 and 356 is achieved similarly as above with respect to FIG. 5. As a conclusion, the simultaneous processing of both A/D and D/A conversion may be summarized as follows: when "Reset/enable" lead 358 is set, ramp generator 340, "up" counter 510 and "down" counter 520 are reset. When "load" lead 352 is set, "up" and "down" counters 510 and 520 are respectively loaded with the digital zero and the digital word to be converted. At the switching of "Reset/enable" lead 358, ramp generator 340, "up" and "down" counters start simultaneously. When "up" counter reaches a value entailing the switching of comparator 150, this digital value being the result of the A/D-processing is loaded into register 320. Also, when "down" counter reaches the value zero, decoded by NOR gate 350, the corresponding analog value at the output of attenuator 120 is stored into Twin S/H circuit 330. Since both A/D and D/A processing use the same components, their transfer functions are exactly inverse each other.

Another possibility to provide both A/D and D/A processing simultaneously would be to use a single counter and a coincidence circuit for comparing the counter output to the digital input to be converted. The counter always counts up and is always loaded with the digital value zero.

Figure 7A:
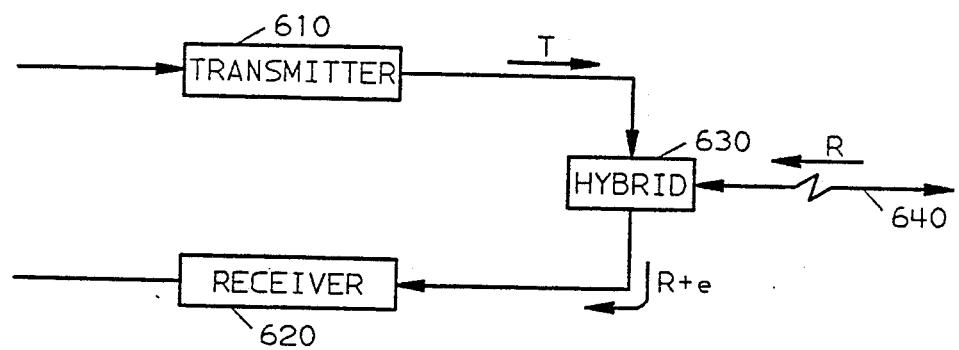
FIG. 7A and 7B illustrate the basic principle of the use of the invention in an echo cancellation architecture.
Figure 7B:
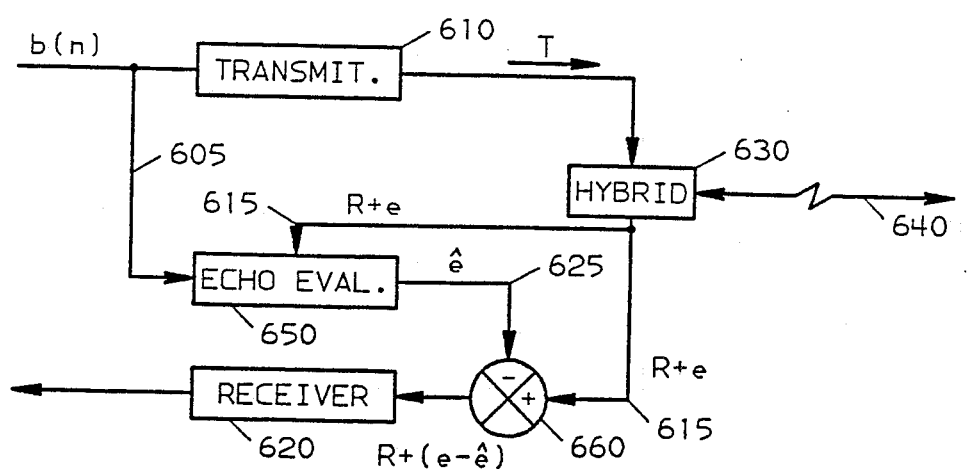

FIGS. 7A and 7B illustrate a typical use of the invention in a echo cancellation device. Indeed, high speed full-duplex data communication on a single channel is of immense practical interest since it involves simultaneous transmission and reception over the same line. A technique for achieving this goal is to provide a mechanism to ensure that the transmitted signal is not fed back into the receiving section of the same end of the line. A transmitter 610 and a receiver 620 are jointly coupled to a two-wire line 640 via an hybrid 630. In an environment of changing channel characteristics (e.g., switched network), the hybrid balancing, if fixed, will at best provide a compromise match to the channel. In this mode, a vestige of the local transmitted signal, leaking through the hybrid, can be expected to interfere with the incoming signal from the far-end simultaneously operating transmitter. FIG. 7A illustrates the system without any echo cancellation technique and FIG. 7B illustrates the system using such a technique. As shown in FIG. 7A, the signal entering into receiver 620 is $$R+e$$

The first term represents the signal from the far end and the second term is the echo signal coming from the mismatch of hybrid 630 and the channel 640. Decisions are made by quantizing samples of receiver's output. A typically encountered echo component arising in a system with a conventional compromise balanced hybrid will cause an unacceptably high error rate. To remove the interfering echo component, the local receiver must perform echo cancellation as in FIG. 7B; that is, estimate by means of an echo estimator 650 the echo signal and subtract it in block 660 from the incoming j signal existing on lead 615 prior to making decisions. The estimation is performed by processing the transmitted signal T on lead 605, the received signal $R+e$ on lead 615. This goal is generally achieved by transversally filtering of the local data symbols b(n). If the b(n) are binary, the implementation is simple, requiring mainly additions and subtractions.

Figure 8:
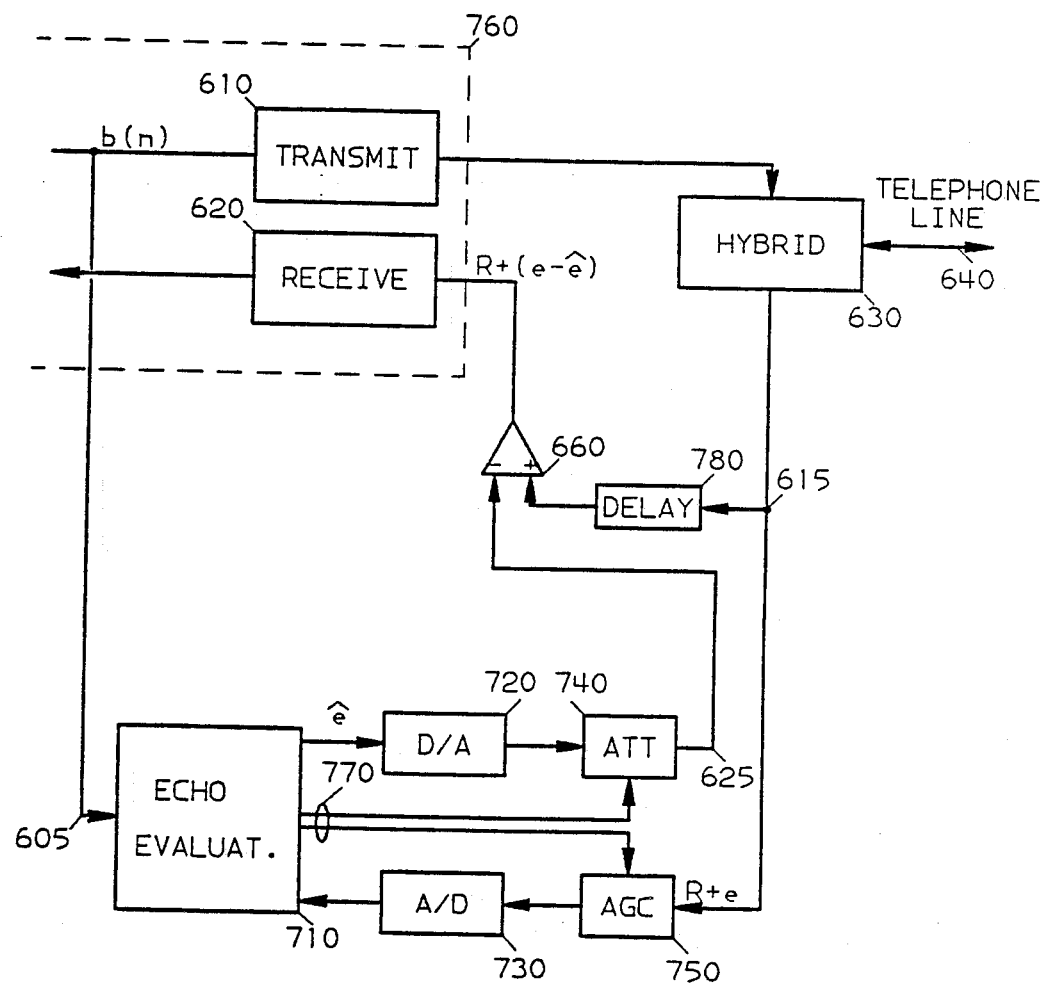
FIG. 8 illustrates with details the use of the invention in an echo cancellation architecture in a standard 4-wire modem.

However, since the level of the received signal is likely to vary significantly, the far-end signal R from the remote modem may vary between 0 and $-43$ dBm, it is essential that proper scaling be done when the error signal is computed. Such scaling involves a gain adjust device, or AGC between the analog to digital conversion prior to echo estimation computing. The result of this computation provides the digital value of estimated echo which must be converted and then attenuated before being subtracted to the received signal. FIG. 8 illustrates such a device: the received signal from hybrid 630 is entered in AGC 750 for proper scaling prior to any computation so as to make the best use of an analog-to-digital converter 730. After amplification and after conversion into digital form of the received signal R +e by A/D block 730, the latter is then entered into echo evaluator 710 which extracts the estimated echo. This is achieved by comparing the sequence of digital values b(n) on lead 605 to the output of A/D 730. The result of this comparison is used in the adaptive process of the adjustment of a digital filter designed to generate the estimated echo. Generally, the tap coefficients of this digital filter are chosen to minimize, in a mean-square sense, the measured receiver error signal which is the difference between the actual receiver output (R+e) on lead 615 and the ideal output built from b(n). Obviously, any other way of choosing the tap coefficients may be used.

Once extracted, the estimated echo is transmitted to D/A block 720 in order to be converted back to analog form. It is then attenuated by attenuator 740 before being subtracted in subtracter 660 to the actual received signal (R+e) after it has been delayed by block 780. This delay is inserted compensate the processing delay between signal on wire 615 and signal on wire 625. The gain provided by AGC 750 and the attenuation produced by attenuator 740 are controlled by echo evaluator 510 by means of control leads 770. As shown in FIG. 8, transmitter 610 and receiver 620 may form the frame of a standard modem 760 having no echo cancellation in itself. Therefore, the use of the invention in this product may add, as an extra feature, such a capability only existing, before, in highly sophisticated and expensive data control equipments.

Figure 9:
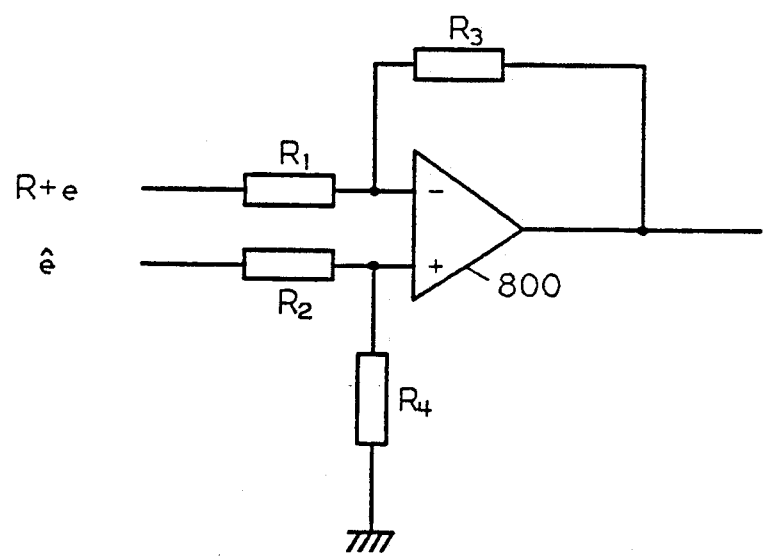
FIG. 9 is an example of an accurate subtracter needed in preferred embodiment of the invention.

As mentioned previously, the transfer functions of A/D-amplification block and D/A-attenuation block must be accurately inverse each other. Indeed, it should be noticed that the residual echo e can be some 30 dB above the far-end signal R. Since good performance at high speeds imply a S/N ratio in the 30 dB, it can be seen that the echo must be regenerated with an error less than 60 dB below the echo itself. Therefore, the interest of the architecture of the present invention becomes obvious: since both A/D-amplification and D/A-attenuation blocks are consisting of the same elements, their characteristics are exactly identical. The subtraction performed in subtracter 660 must also have a precision tolerance of about 0.001 in order to allow a good efficiency of the echo cancellation device. A subtracter having such a tolerance may easily be manufactured by means of an operational amplifier 800, such as in FIG. 9, connected so as to build a differential amplifier by means of 4 resistors R1, R2, R3 and R4. The values of those resistors can easily be chosen to be accurately equal by laser trimming on the same substrate.

It should also be noticed that the amplification block 750 is associated with A/D block 730 since most often, the analog signal to be processed by digital processing means, such as echo evaluator 710, must be amplified for proper scaling before A/D conversion. However, except this point, the association of a A/D conversion and an amplifier is arbitrary and the invention could obviously be applied to provide a system for performing either a A/D-attenuation and either a D/A-amplification step.

We claim:

1. A conversion system for performing either an analog-to-digital (A/D) conversion associated with an amplification step or a digital-to-analog (D/A) conversion associated with an attenuation step, comprising
    a D/A conversion (110) for converting digital words into their analog representation,
    means (140) for generating a sequence of digital words to said D/A converter (110) during an A/D conversion,
    an attenuator (120) for attenuating the analog output of said D/A converter (110),
    means (165) for receiving an input analog value to be converted,
    a comparator (150) for comparing the value of said input analog value and the output of said attenuator (120),
    means (220) responsive to the output of the comparator for selecting from said sequence of digital words the digital words the digital word that minimizes the difference between both inputs of said comparator (150), said selected digital word being an amplified representation of said analog input value by virtue of said attenuator so as to perform said A/D conversion associated with an amplification step,
    means (115) for receiving a digital input word to be converted,
    means (140) for transferring said digital input word into said D/A converter (110), and
    means (130) for storing the analog output of said attenuator (120) corresponding to an attenuated analog representation of said digital input word, so as to perform said D/A conversion associated with an attenuation step,
    whereby said analog-to-digital conversion associated with an amplification step and said digital-to-analog conversion associated with an attenuation step have precise inverse transfer functions by virtue of the attenuator which attenuates during both the analog-to-digital conversion and the digital-to-analog conversion.

2. A conversion system according to claim 1, characterized in that:
    said means for generating a sequence of digital words include means (276) for generating a first digital word having its most significant bit set to one level and all remaining bits set to the opposite level, and for generating the other digital words according to a successive approximation process.

3. A conversion system according to claim 1, characterized in that:
    said means for generating a sequence of digital words includes a counter for generating an arithmetic sequence of successive digital words.

4. A conversion system according to claim 2, characterized in that it further includes:
    a first register (210) for storing said digital input word to be converted,
    a successive approximation register SAR (276) for generating said sequence of digital words according to a successive approximation algorithm and connected to said comparator (150),
    means (221, . . . 228) for transmitting the content of said first register (210) to the input of said D/A converter 110 in order to perform said digital-to-analog conversion associated to an attenuation, and for transmitting the output of said SAR (276) to said D/A converter 110 in order to perform said analog-to-digital conversion associated to said amplification, a second register (220) for storing the last digital word generated according to said successive approximation algorithm, the last bit of which being amended or not according to the result of the last comparison performed by said comparator (150).

5. An echo cancellation device for compensating for echo generated by the use of a hybrid circuit (630) connected to a full-duplex communication line, comprising an echo estimator responsive to digital signals enroute to the communication line via the hybrid circuit and to digital representation of signals received from the communication line via the hybrid circuit for generating digital estimates of the echo signals, a conversion circuit for generating the digital representations of the signals received from the communications line for input to the echo estimator and for generating analog representations of the estimated echo signals, and a subtracter (660) for subtracting the analog representations of the estimated echo from the analog signals from the communication line, said conversion circuit further comprising a digital-to-analog (D/A) converter (110), means (140) for generating a sequence of digital words to said D/A converter (110) during an A/D conversion, an attenuator (120) for attenuating the analog output of said D/A converter (110), a comparator (150) for comparing the input analog signals from the communications line with the output of said attenuator(120), means (220) responsive to the output of the comparator for selecting from said sequence of digital words the digital word that minimizes the difference between both inputs of said comparator (150), said selected digital word being an amplified representation of an analog input value from the communication line, means (140) for transferring a said digital estimate from the echo estimator into said D/A converter (110) during a D/A conversion, and means (130) for storing the analog output of said attenuator (120) corresponding to an attenuated analog representation of a said echo estimate, whereby, the analog signals from the communication line are amplified before echo estimation and the estimated digital echo signals are attenuated by precise inverse transfer functions by virtue of the attenuator which attenuates during both the analog-to-digital conversion and the digital-to-analog conversion.

6. An echo cancellation device according to claim 5; characterized in that:

said means for generating a sequence of digital words include means (276) for generating a first digital word having its most significant bit set to one level and all remaining bits set to the opposite level, and for generating the other digital words according to a successive approximation process.

7. An echo cancellation device according to claim 5, characterized in that:

said means for generating a sequence of digital words includes a counter for generating an arithmetic sequence of successive digital words.

* * * * *